US012128664B2

(12) United States Patent
Masuda et al.

(10) Patent No.: US 12,128,664 B2
(45) Date of Patent: Oct. 29, 2024

(54) AFFIXING METHOD AND AFFIXING APPARATUS

(71) Applicant: DISCO CORPORATION, Tokyo (JP)

(72) Inventors: Yohei Masuda, Tokyo (JP); Ye Chen, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/811,204

(22) Filed: Jul. 7, 2022

(65) Prior Publication Data

US 2023/0014530 A1    Jan. 19, 2023

(30) Foreign Application Priority Data

Jul. 14, 2021 (JP) .................................. 2021-116770

(51) Int. Cl.
| | |
|---|---|
| *B32B 38/18* | (2006.01) |
| *B32B 37/10* | (2006.01) |
| *B32B 37/18* | (2006.01) |
| *B32B 41/00* | (2006.01) |
| *H01L 21/67* | (2006.01) |

(52) U.S. Cl.
CPC .......... *B32B 38/1858* (2013.01); *B32B 37/10* (2013.01); *B32B 37/18* (2013.01); *B32B 41/00* (2013.01); *H01L 21/67132* (2013.01); *B32B 2309/68* (2013.01); *B32B 2457/14* (2013.01)

(58) Field of Classification Search
CPC ..... B32B 37/10; B32B 37/18; B32B 38/1858; B32B 41/00; B32B 2309/68; B32B 2457/14; H01L 21/67132; H01L 21/6838; H01L 21/6836; H01L 2221/68327
See application file for complete search history.

(56) References Cited

U.S. PATENT DOCUMENTS

| | | | |
|---|---|---|---|
| 2007/0249146 A1* | 10/2007 | Masuda ............ | H01L 21/67132 438/464 |
| 2019/0385887 A1* | 12/2019 | Kiuchi .............. | H01L 21/67092 |
| 2020/0126859 A1* | 4/2020 | Harada ............... | H01L 21/6836 |
| 2020/0227303 A1* | 7/2020 | Saito ................. | H01L 21/67253 |
| 2020/0373176 A1* | 11/2020 | Priewasser ......... | H01L 21/3043 |
| 2021/0129260 A1* | 5/2021 | Chen .................... | H01L 21/447 |

FOREIGN PATENT DOCUMENTS

JP           2014150109 A     8/2014

* cited by examiner

*Primary Examiner* — Alex B Efta
*Assistant Examiner* — Alexander S Wright
(74) *Attorney, Agent, or Firm* — Greer Burns & Crain Ltd.

(57) ABSTRACT

An affixing method includes a pressing step of pressing a tape against a wafer with a tape affixing roller and pressing the wafer against a suction table with the tape affixing roller, an evacuating step of evacuating a vacuum chamber that houses the suction table and the tape affixing roller therein to create a vacuum in the vacuum chamber, and an affixing step of affixing the tape to the wafer with the tape affixing roller by causing the tape affixing roller to roll on the tape while the tape affixing roller is pressing the wafer.

7 Claims, 10 Drawing Sheets

AFFIXING METHOD AND AFFIXING APPARATUS

BACKGROUND OF THE INVENTION

Field of the Invention

The present invention relates to an affixing method and an affixing apparatus for affixing a tape to a wafer.

Description of the Related Art

Vacuum wafer mounters are widely used in the art as an apparatus for affixing a tape to a wafer. A vacuum wafer mounter includes a vacuum chamber for accommodating a wafer therein and affixing a tape to the wafer while being kept in a vacuum (see, for example, Japanese Patent Laid-Open No. 2014-150109).

Since a tape is affixed to a wafer in the evacuated vacuum chamber, the vacuum chamber is advantageous in that the tape is prevented from being improperly affixed to the wafer due to air bubbles that would otherwise be trapped between the wafer and the tape and wrinkles that would otherwise be formed in the tape.

SUMMARY OF THE INVENTION

Unless a wafer is secured in position when a tape is affixed to the wafer, the wafer may tend to move and suffer damage. In a case in which a tape affixed to an annular frame in covering relation to the opening of the annular frame is to be affixed to a wafer, if the wafer moves in the process of affixing the tape to the wafer, the wafer may not be affixed to the tape in a proper position with respect to the annular frame.

The vacuum chamber disclosed in Japanese Patent Laid-Open No. 2014-150109 uses an electrostatic chuck for fixing a wafer in position in the vacuum chamber. Generally, electrostatic chucks are highly expensive and require a high-voltage power supply for their operation. Consequently, there have been demands for fixing a wafer in a vacuum chamber without using an electrostatic chuck.

It is therefore an object of the present invention to provide an affixing method and an affixing apparatus for properly affixing a tape to a wafer without the use of an electrostatic chuck.

In accordance with an aspect of the present invention, there is provided an affixing method of affixing a tape to a wafer, including a holding step of holding the wafer under suction on a suction table, a positioning step of, before or after the holding step, positioning the tape in facing relation to the wafer on the suction table and positioning a tape affixing roller in facing relation to the wafer with the tape interposed therebetween, a pressing step of, after the holding step and the positioning step, pressing the tape against the wafer with the tape affixing roller and pressing the wafer against the suction table with the tape affixing roller, an evacuating step of, after the pressing step, evacuating a vacuum chamber that houses therein the suction table holding the wafer under suction thereon and the tape affixing roller, while the tape affixing roller is pressing the wafer, and an affixing step of, after the evacuating step, causing the tape affixing roller to roll on the tape to affix the tape to the wafer while the tape affixing roller is pressing the wafer.

Preferably, the pressing step includes a step of causing the tape affixing roller to press a central area of the wafer through the tape interposed therebetween. Alternatively, the pressing step includes a step of causing the tape affixing roller to press an outer circumferential portion of the wafer through the tape interposed therebetween.

Preferably, the tape is free of a glue layer, and the affixing step includes a step of affixing the tape to the wafer while heating the wafer and the tape.

In accordance with another aspect of the present invention, there is provided an affixing apparatus that affixes a tape to a wafer, including a suction table for holding the wafer under suction thereon, a tape holding table for holding the tape thereon in facing relation to the wafer on the suction table, a tape affixing roller disposed in facing relation to the wafer with the tape interposed therebetween and movable along a direction across a face side of the wafer and a direction along the face side of the wafer, a vacuum chamber for housing the suction table, the tape holding table, and the tape affixing roller therein, the vacuum chamber being evacuatable, and a control unit configured to control the tape affixing roller and the vacuum chamber, in which the control unit, while controlling the tape affixing roller to press the tape against the face side of the wafer and controlling the tape affixing roller to press the wafer against the suction table, evacuates the vacuum chamber and controls the tape affixing roller to roll on the tape while the tape affixing roller is pressing the wafer.

The present invention offers an advantage in that it is possible to affix a tape properly to a wafer without using an electrostatic chuck.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described above. Furthermore, the arrangements described below can be combined in appropriate manners. Various omissions, replacements, or changes of the arrangements may be made without departing from the scope of the present invention. In the description to be described below, those components that are identical to each other are denoted by identical reference characters.

First Embodiment

Figure 1:
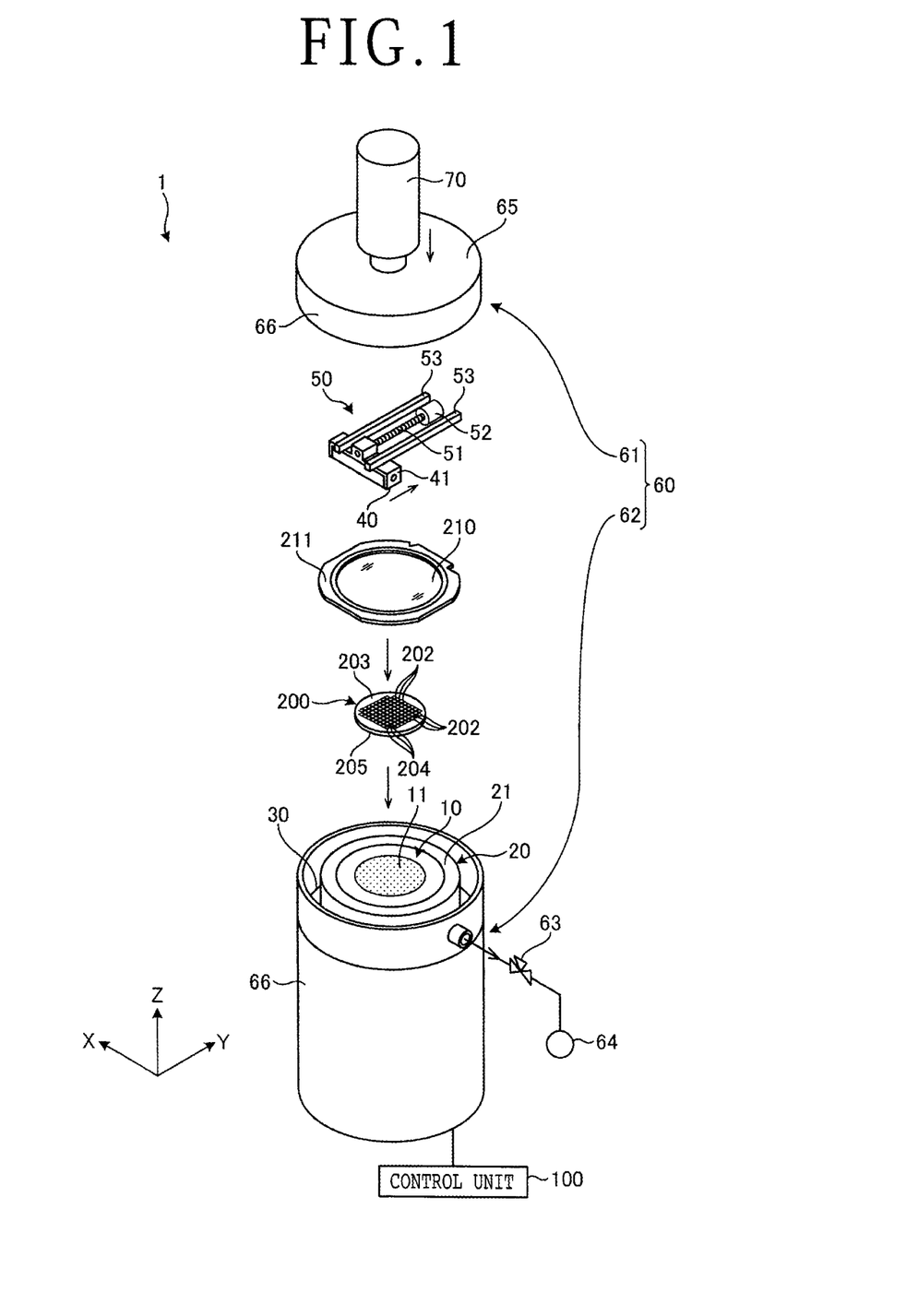
FIG. 1 is an exploded perspective view illustrating a configuration example of an affixing apparatus according to a first embodiment of the present invention.
Figure 2:
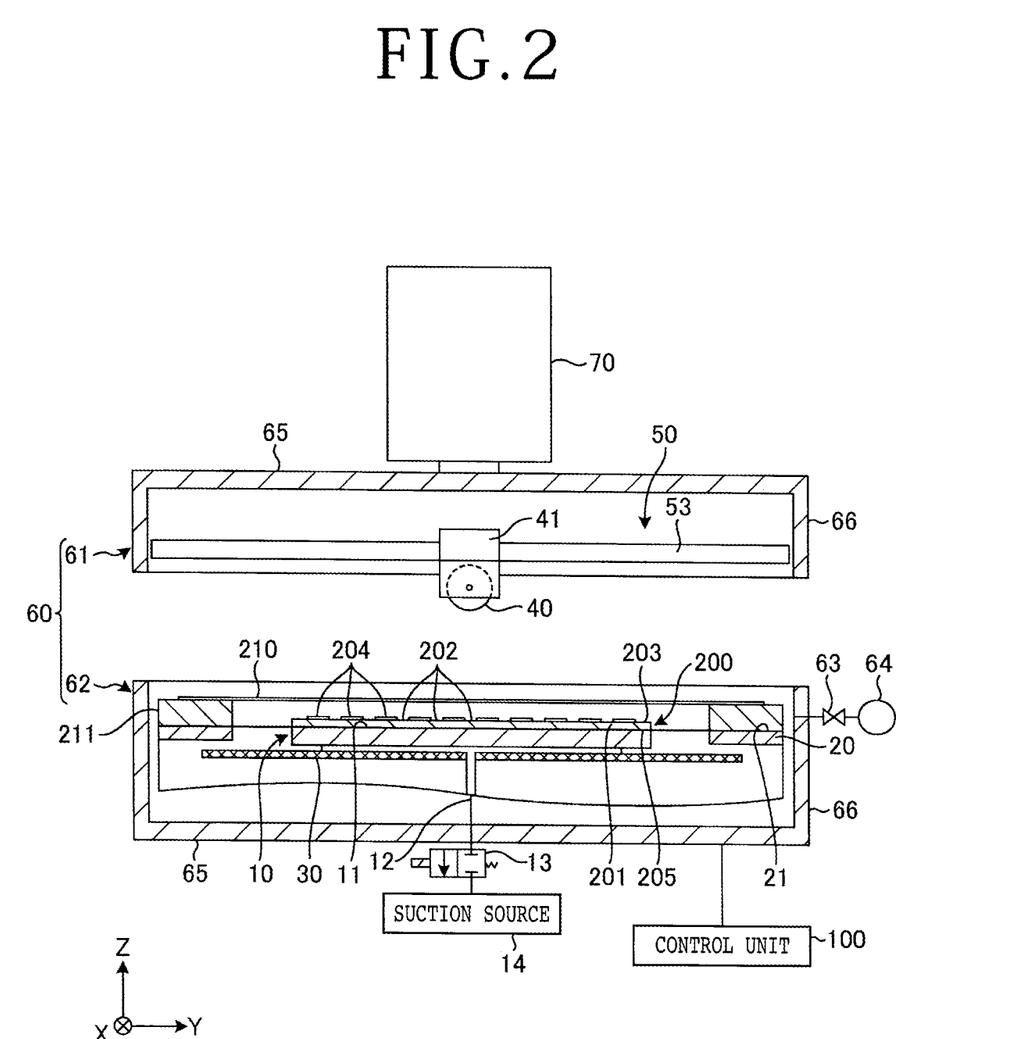
FIG. 2 is an enlarged cross-sectional view schematically illustrating the configuration example of the affixing apparatus illustrated in FIG. 1.

An affixing apparatus and an affixing method according to a first embodiment of the present invention will be described hereinbelow with reference to the drawings. FIG. 1 illustrates in exploded perspective a configuration example of the affixing apparatus according to the first embodiment. FIG. 2 schematically illustrates in enlarged cross section the configuration example of the affixing apparatus illustrated in FIG. 1.

The affixing apparatus, denoted by 1, according to the first embodiment illustrated in FIG. 1 is an apparatus for affixing a tape 210 to a face side 203 of a wafer 200 also illustrated in FIG. 2. The wafer 200 to which the tape 210 is to be affixed by the affixing apparatus 1 according to the first embodiment includes a disk-shaped semiconductor wafer, optical device wafer, or the like having a substrate 201 made of silicon (Si), sapphire ($Al_2O_3$), gallium arsenide (GaAs), silicon carbide (SiC), or the like.

As illustrated in FIG. 1, the wafer 200 has a plurality of devices 204 formed in respective areas demarcated on the face side 203 by a plurality of intersecting projected dicing lines 202. Each of the devices 204 may include, for example, a circuit such as an integrated circuit (IC) or a large scale integration (LSI) circuit, an image sensor such as a charge coupled device (CCD) or a complementary metal oxide semiconductor (CMOS), a microelectromechanical system (MEMS), or the like.

According to the first embodiment, an annular frame 211 is affixed to the lower surface of an outer edge portion of a tape 210 shaped as a circular sheet that is larger in diameter than the wafer 200. The tape 210 is affixed to the face side 203 of the wafer 200 and supported in an opening defined in the annular frame 211. The wafer 200 will be divided along the projected dicing lines 202 into individual device chips including the respective devices 204.

The tape 210 is made of thermoplastic resin, formed into a tape-like shape, and has a planar area larger than the area of the wafer 200. The tape 210 has a face side and a reverse side that are planar. The thermoplastic resin that the tape 210 is made of is pliable and non-adhesive. The tape 210 does not include a glue layer of adhesive resin. According to the first embodiment, the tape 210 is made of polyolefin resin as the thermoplastic resin, for example. According to the first embodiment, the tape 210 has a thickness in a range from 50 to 150 μm. According to the present invention, the tape 210 may include a glue layer.

The affixing apparatus 1 according to the first embodiment is an apparatus for affixing the tape 210, which is larger in diameter than the wafer 200 and has an outer edge affixed to the annular frame 211, to the face side 203 of the wafer 200. As illustrated in FIGS. 1 and 2, the affixing apparatus 1 includes a suction table 10, a tape holding table 20, a heating unit 30, a tape affixing roller 40, a roller moving unit 50, a vacuum chamber 60, a lifting and lowering unit 70, and a control unit 100.

The suction table 10 securely holds the wafer 200 on an upper holding surface 11 that lies parallel to horizontal lines. The suction table 10 is shaped as a circular plate that is equal in diameter to the wafer 200, and is made of porous ceramics or the like. The suction table 10 is connected to a suction source 14 such as an ejector through a suction channel 12 having an on-off valve 13. When the wafer 200 is placed on the suction table 10, the wafer 200 has its reverse side 205 held in contact with the holding surface 11. The wafer 200 placed on the holding surface 11 is held under suction thereon by a negative pressure produced by the suction source 14 and acting on the holding surface 11.

The tape holding table 20 holds the tape 210 in facing relation to the wafer 200 on the suction table 10. According to the first embodiment, the tape holding table 20 is of an annular shape whose outside and inside diameters are the same as the outside and inside diameters, respectively, of the annular frame 211. The tape holding table 20 has an upper rest surface 21 lying parallel to horizontal directions. The annular frame 211 that is affixed to the outer edge portion of the tape 210 is placed on the upper rest surface 21 of the tape holding table 20, so that the tape holding table 20 holds the tape 210 through the annular frame 211 interposed therebetween.

The tape holding table 20 is disposed coaxially with the suction table 10, with the rest surface 21 being higher than the holding surface 11. Since the annular frame 211 affixed to the lower surface of the outer edge portion of the tape 210 is placed on the rest surface 21 that is higher than the holding surface 11, the tape holding table 20 holds the tape 210 in facing relation to the wafer 200 on the suction table 10 along Z-axis directions that lie parallel to vertical directions.

The heating unit 30 applies infrared rays to the tape 210 held on the tape holding table 20 and the suction table 10 for thereby heating the tape 210 directly and heating the wafer 200 through the suction table 10. The heating unit 30 is shaped as a circular plate whose diameter is larger than the inside diameter of the annular frame 211, and is disposed coaxially with suction table 10 and the tape holding table 20. The heating unit 30 is disposed below the suction table 10.

The tape affixing roller 40 faces the wafer 200 held on the suction table 10 along the Z-axis directions with the tape 210 held on the tape holding table 20 being interposed therebetween. The tape affixing roller 40 is movable along the Z-axis directions across (in the first embodiment, perpendicular to) the face side 203 of the wafer 200 and also along Y-axis directions extending along the face side 203 of the wafer 200 and perpendicularly to the axis of the tape affixing roller 40.

The tape affixing roller 40 is rotatably supported on a support member 41 for rotation about its axis extending parallel to the horizontal directions, and is disposed above the tape 210 held on the tape holding table 20 and the wafer 200 held on the suction table 10. The axis of the tape affixing roller 40 extends parallel to the X-axis directions that are parallel to horizontal directions and perpendicular to the Y-axis directions.

In operation, the tape affixing roller 40 is moved in the Y-axis directions along the face side 203 of the wafer 200 by the roller moving unit 50, and is moved in the Z-axis directions by the lifting and lowering unit 70. When lowered by the lifting and lowering unit 70, the tape affixing roller 40 pushes the tape 210 held on the tape holding table 20 toward the wafer 200 and the suction table 10, and presses the tape 210 against the wafer 200 and also presses the wafer 200 against the suction table 10.

The tape affixing roller 40 is thus placed in a position where, when lowered by the lifting and lowering unit 70, the tape affixing roller 40 presses the tape 210 against the wafer 200 and also presses the wafer 200 against the suction table 10. Moreover, when lowered by the lifting and lowering unit 70 and moved along the face side 203 of the wafer 200 by the roller moving unit 50, the tape affixing roller 40 rolls on the tape 210 while pressing the tape 210 held on the tape holding table 20 against the wafer 200 and also pressing the wafer 200 against the suction table 10.

The roller moving unit 50 moves the tape affixing roller 40 in the Y-axis directions. The roller moving unit 50 includes a known ball screw 51 operatively coupled to the support member 41 and rotatable about an axis parallel to the Y-axis directions, an electric motor 52 for rotating the ball screw 51 about its axis to move the support member 41 along the Y-axis directions, and a pair of known guide rails 53 extending along the Y-axis directions for supporting and guiding the support member 41 to move along the Y-axis directions.

The vacuum chamber 60 includes a container housing therein the suction table 10, the tape holding table 20, the heating unit 30, the tape affixing roller 40, and the roller moving unit 50. The container can be evacuated to create a vacuum therein. The vacuum chamber 60 includes an upper casing 61 and a lower casing 62 that are removable selectively toward and away from each other between a state where their outer edges are held in contact with each other and another state where their outer edges are spaced from each other, and a vacuum pump 64 connected to the lower casing 62 through an on-off valve 63.

Each of the upper and lower casings 61 and 62 includes a circular plate 65 whose diameter is larger than the outside diameter of the annular frame 211 and a hollow cylindrical wall 66 extending perpendicularly from an outer edge of the circular plate 65. The upper and lower casings 61 and 62 have the circular plates of the same outer diameter. The upper and lower casings 61 and 62 are disposed coaxially with each other and have their respective inner spaces or openings facing each other along the Z-axis directions. The upper casing 61 is vertically movable by the lifting and lowering unit 70.

When the upper casing 61 is lowered by the lifting and lowering unit 70, the outer edges of the hollow cylindrical walls 66 of the upper and lower casing 61 and 62 are brought into intimate contact with each other in an air-tight fashion. The vacuum chamber 60 now has its inner space isolated from outside and hermetically sealed. The lower casing 62 houses the suction table 10, the tape holding table 20, and the heating unit 30 securely therein. The upper casing 61 houses therein the roller moving unit 50 with the guide rails 53 fixed in position.

The control unit 100 controls the components of the affixing apparatus 1, which include the suction table 10, the tape holding table 20, the tape affixing roller 40, and the vacuum chamber 60, to enable the affixing apparatus 1 to perform a tape affixing process of affixing the tape 210 to the face side 203 of the wafer 200. The control unit 100 includes a computer for executing computer programs regarding the tape affixing process. The computer includes an arithmetic processing device having a microprocessor such as a central processing unit (CPU), a storage device having a memory such as a read only memory (ROM) or a random access memory (RAM), and an input/output interface device.

The arithmetic processing device of the control unit 100 reads computer programs stored in the ROM and runs the computer programs in the RAM to generate control signals for controlling the affixing apparatus 1. The arithmetic processing device then outputs the generated control signals through the input/output interface device to the components of the affixing apparatus 1.

The control unit 100 is electrically connected to a display unit, not depicted, such as a liquid crystal display device, for displaying states and images in a processing operation, and an input unit, not depicted, that can be used by an operator of the affixing apparatus 1 to register processing content information, etc. The input unit may include at least one of a touch panel included in the display unit and a keyboard, etc.

Figure 3:
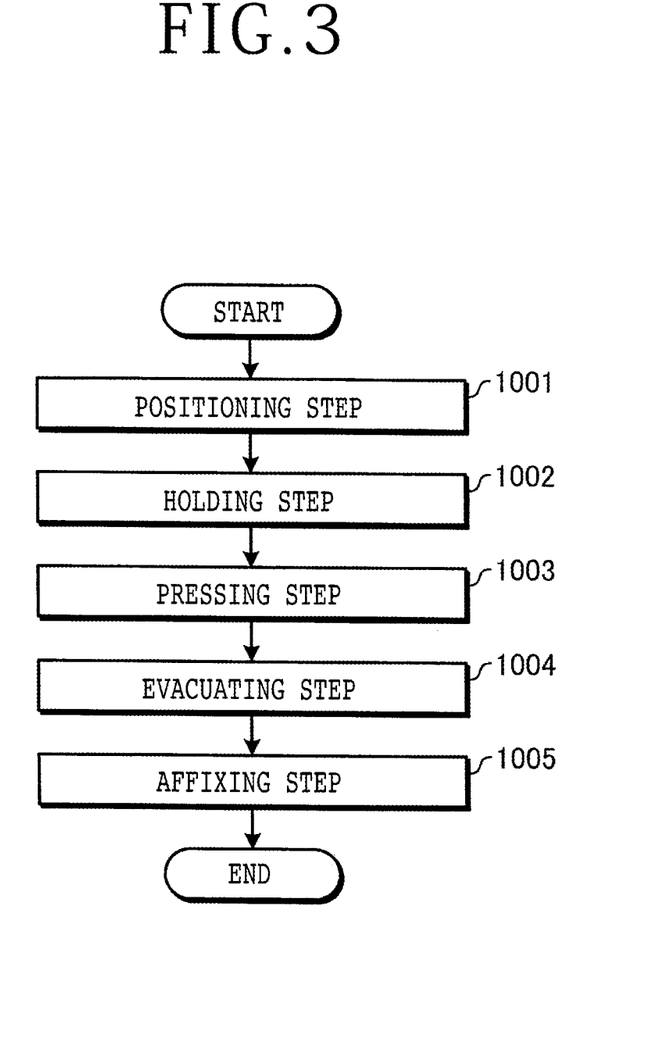
FIG. 3 is a flowchart of the sequence of an affixing method according to the first embodiment.

A tape affixing process carried out by the affixing apparatus 1 of the above configuration, i.e., the affixing method according to the first embodiment, will be described hereinbelow. FIG. 3 is a flowchart of the sequence of the affixing method according to the first embodiment.

The affixing method is a method carried out by the affixing apparatus 1 to affix the tape 210 to the wafer 200. The affixing apparatus 1 of the above configuration performs the tape affixing process, i.e., the affixing method, when the control unit 100 controls the components of the affixing apparatus 1, according to the sequence illustrated in FIG. 3. As illustrated in FIG. 3, the affixing method includes a positioning step 1001, a holding step 1002, a pressing step 1003, an evacuating step 1004, and an affixing step 1005.

(Positioning Step)

The positioning step 1001 is a step of positioning the tape 210 in facing relation to the wafer 200 on the suction table 10 and also positioning the tape affixing roller 40 in facing relation to the wafer 200 with the tape 210 interposed therebetween, prior to holding step 1002. In the positioning step 1001, specifically, the lifting and lowering unit 70 lifts the upper casing 61 to vent the vacuum chamber 60 to the atmosphere. Then, the reverse side 205 of the wafer 200 is placed on the holding surface 11 of the suction table 10, and the annular frame 211 to which the outer edge portion of the tape 210 has been affixed is placed on the tape holding table 20, thereby positioning the tape 210 in facing relation to the wafer 200 on the suction table 10 and also positioning the tape affixing roller 40 in facing relation to the wafer 200 with the tape 210 interposed therebetween.

(Holding Step)

The holding step 1002 is a step of holding the wafer 200 under suction on the suction table 10. In the holding step 1002, specifically, when the control unit 100 receives an operation start command from the operator through the input unit or the like, the vacuum chamber 60 is vented to the atmosphere. Then, the control unit 100 opens the on-off valve 13 to apply a negative pressure from the suction source 14 to the holding surface 11 of the suction table 10, thereby holding the reverse side 205 of the wafer 200 under suction on the holding surface 11 of the suction table 10. The control unit 100 energizes the heating unit 30 to heat the tape 210 held on the tape holding table 20 to soften the tape 210 and also to heat the wafer 200 held on the suction table 10.

(Pressing Step)

Figure 4:
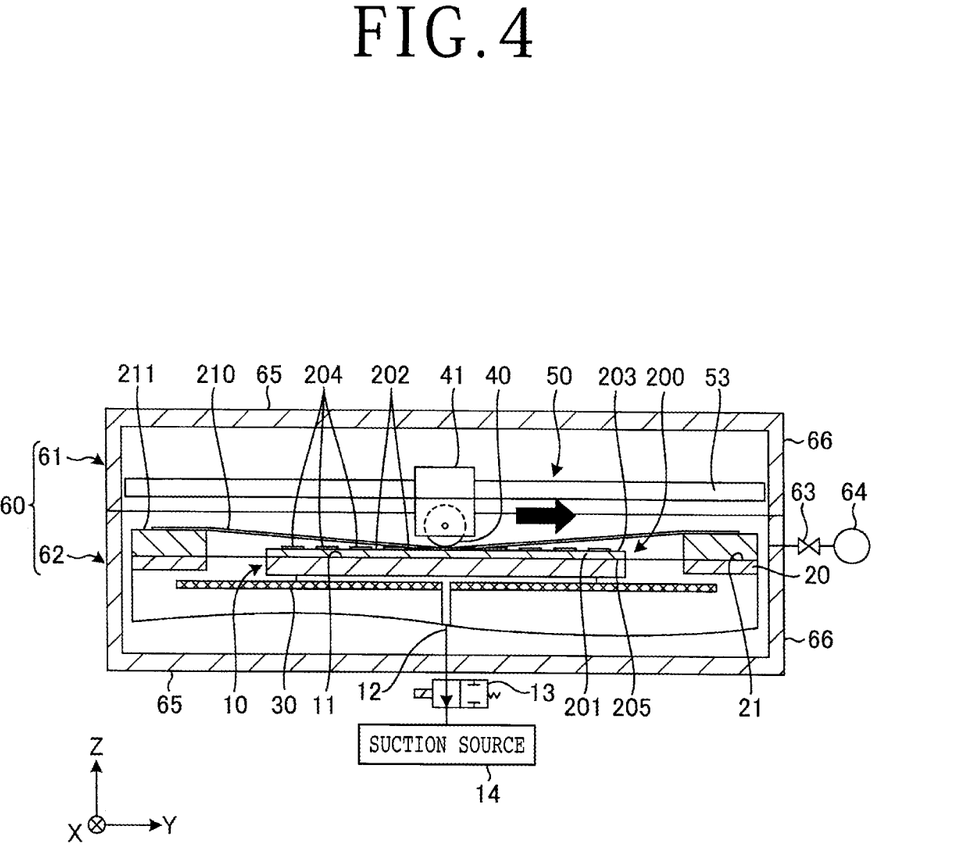
FIG. 4 is an enlarged cross-sectional view schematically illustrating a pressing step of the affixing method illustrated in FIG. 3.

FIG. 4 schematically illustrates in enlarged cross section the pressing step 1003 of the affixing method illustrated in FIG. 3. The pressing step 1003 is a step of pressing the tape 210 against the wafer 200 with the tape affixing roller 40 and also pressing the wafer 200 against the suction table 10 with the tape affixing roller 40, after the positioning step 1001 and the holding step 1002.

In the pressing step 1003, specifically, the control unit 100 controls the roller moving unit 50 to position the tape affixing roller 40 above a central area of the holding surface 11 of the suction table 10 in the Y-axis directions and also controls the lifting and lowering unit 70 to lower the upper casing 61, causing the tape affixing roller 40 to press a central area of the tape 210 in the Y-axis directions against a central area of the wafer 200 and causing the tape affixing roller 40 to press the wafer 200 against the suction table 10, as illustrated in FIG. 4. According to the first embodiment, in the pressing step 1003, the tape affixing roller 40 thus presses the central area of the wafer 200 through the tape 210 interposed therebetween.

(Evacuating Step)

The evacuating step 1004 is a step of evacuating the vacuum chamber 60 that houses the suction table 10 holding the wafer 200 under suction thereon and the tape affixing roller 40 while the tape affixing roller 40 is pressing the wafer 200, creating vacuum in the vacuum chamber 60, after the pressing step 1003. According to the first embodiment, in the evacuating step 1004, specifically, while the tape affixing roller 40 is pressing the wafer 200 against the suction table 10 through the tape 210 and the roller moving unit 50 is stopping moving the tape affixing roller 40, the control unit 100 opens the on-off valve 63 and actuates the vacuum pump 64 to evacuate the vacuum chamber 60, creating a vacuum in the vacuum chamber 60. The vacuum referred to herein represents a pressure lower than the atmospheric pressure, also referred to as a negative pressure.

(Affixing Step)

Figure 5:
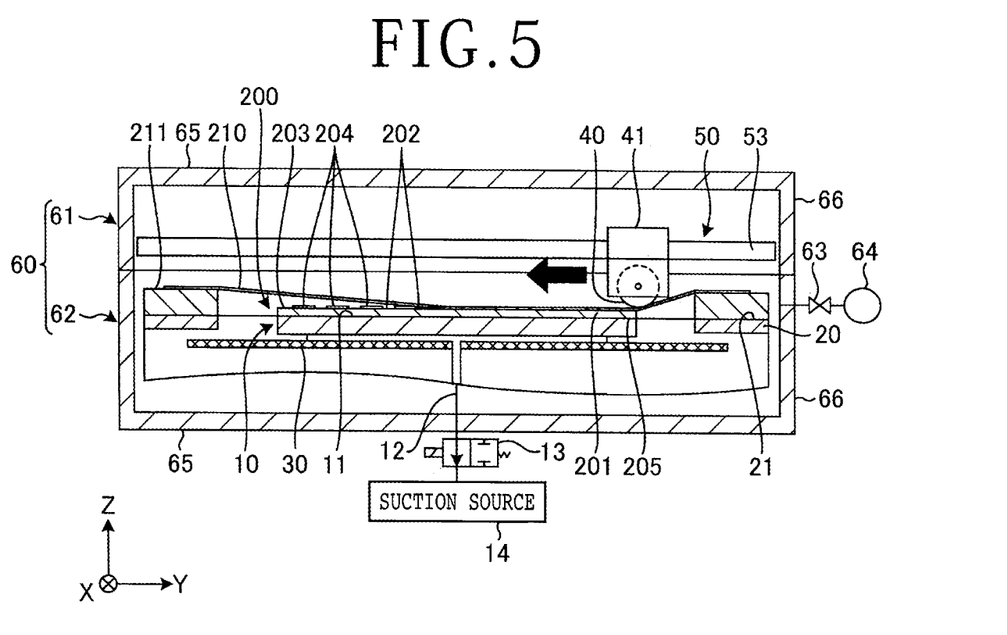
FIG. 5 is an enlarged cross-sectional view schematically illustrating a manner in which a tape affixing roller has been moved to a position above an end of a wafer in a Y-axis direction in an affixing step of the affixing method illustrated in FIG. 3.
Figure 6:
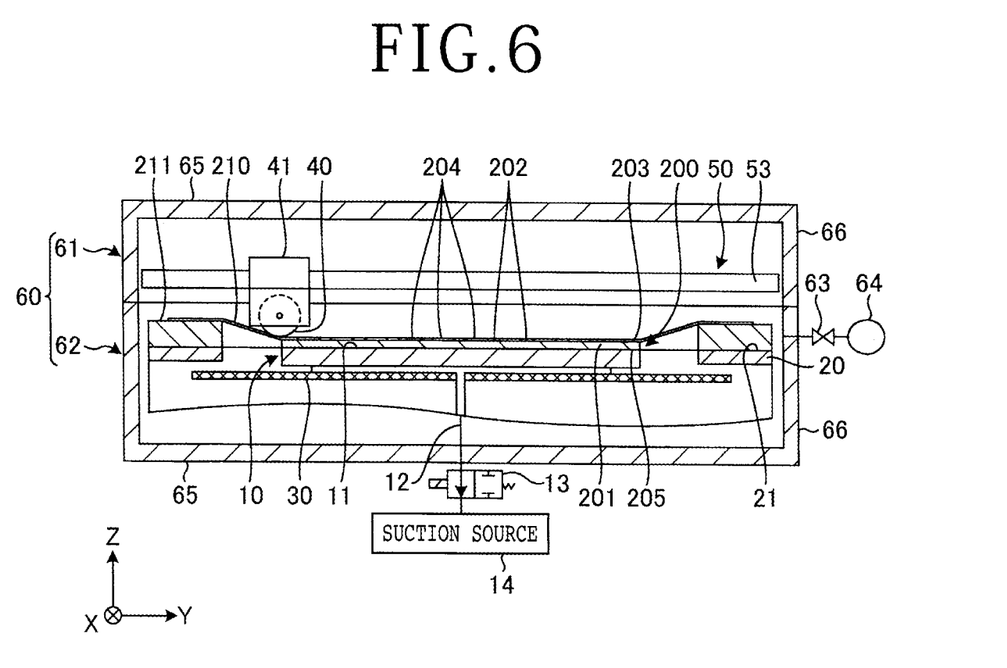
FIG. 6 is an enlarged cross-sectional view schematically illustrating a manner in which the tape affixing roller has been moved to a position above an opposite end of the wafer in the Y-axis direction in the affixing step of the affixing method illustrated in FIG. 3.
Figure 7:
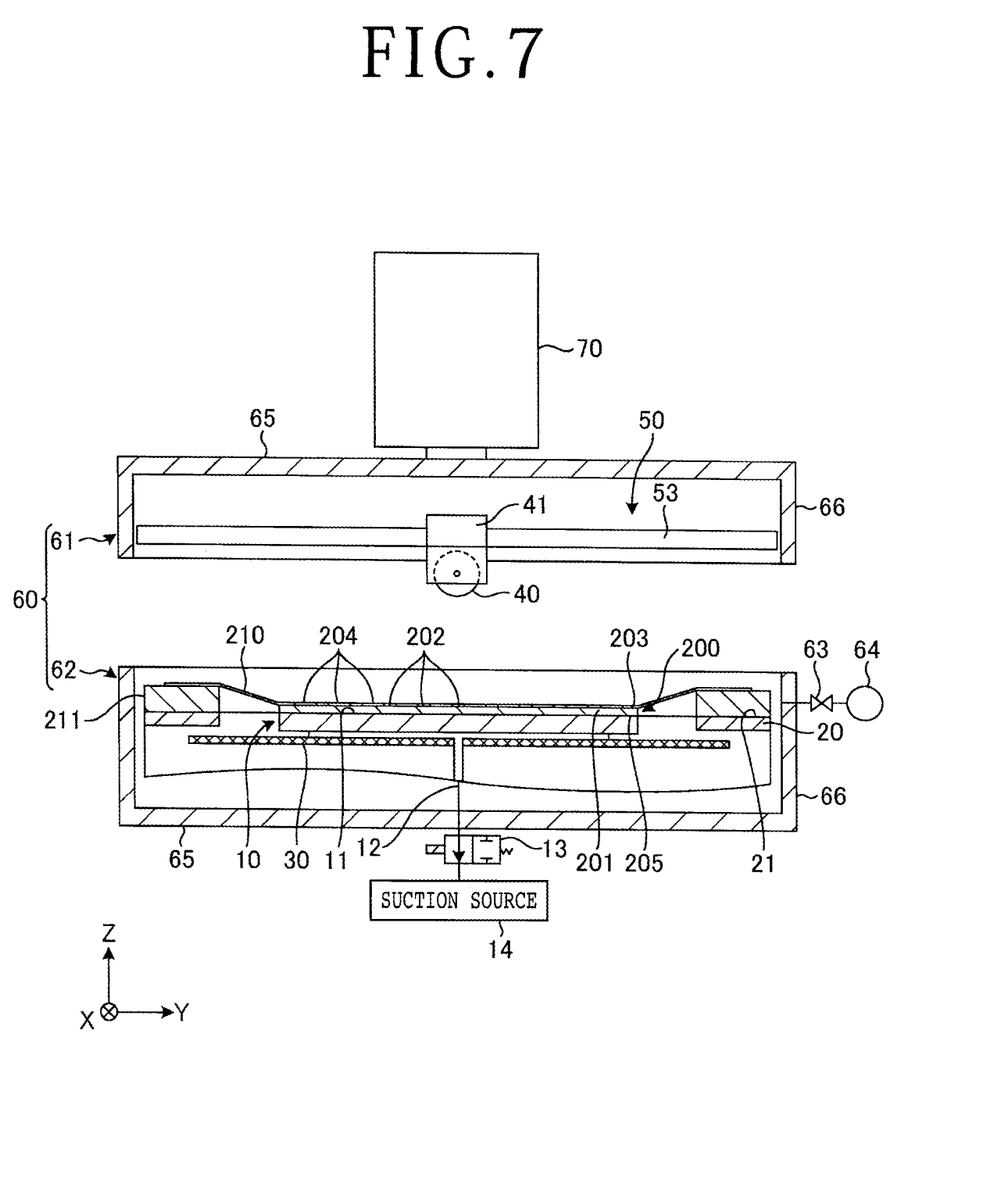
FIG. 7 is an enlarged cross-sectional view schematically illustrating a manner in which a vacuum chamber has been vented to the atmosphere in the affixing step of the affixing method illustrated in FIG. 3.

FIG. 5 schematically illustrates in enlarged cross section the manner in which the tape affixing roller 40 has been moved to a position above an end of the wafer 200 in one of the Y-axis directions in the affixing step 1005 of the affixing method illustrated in FIG. 3. FIG. 6 schematically illustrates in enlarged cross section the manner in which the tape affixing roller 40 has been moved to a position above an opposite end of the wafer 200 in the Y-axis direction in the affixing step 1005 of the affixing method illustrated in FIG. 3. FIG. 7 schematically illustrates in enlarged cross section the manner in which the vacuum chamber 60 has been vented to the atmosphere in the affixing step 1005 of the affixing method illustrated in FIG. 3.

The affixing step 1005 is a step of affixing the tape 210 to the wafer 200 by causing the tape affixing roller 40 to roll on the tape 210 while pressing the tape affixing roller 40 against the wafer 200, after the evacuating step 1004. In the affixing step 1005, specifically, while the vacuum chamber 60 is being evacuated to create a vacuum therein, the control unit 100 controls the roller moving unit 50 to move the tape affixing roller 40 toward one end of the wafer 200 in one of the Y-axis directions during which time the tape affixing roller 40 is pressing the wafer 200 held under suction on the suction table 10, against the suction table 10.

In the affixing step 1005, the control unit 100 controls the roller moving unit 50 to cause the tape affixing roller 40 to roll on the tape 210, causing the tape affixing roller 40 to bring the tape 210 into intimate contact with the face side 203 of the wafer 200, until the tape affixing roller 40 moves to the one end of the wafer 200 in the Y-axis direction, as illustrated in FIG. 5.

Since the tape 210, which is made of thermoplastic resin as described above, has been heated and softened by the heating unit 30, the tape 210 is bonded to the face side 203 of the wafer 200 when it is brought into intimate contact with the face side 203 of the wafer 200 by the tape affixing roller 40. As illustrated in FIG. 5, the tape 210 remains in intimate contact with the face side 203 of the wafer 200 even after the tape affixing roller 40 has passed by. According to the first embodiment, in the affixing step 1005, while the wafer 200 and the tape 210 are being heated, the tape 210 is bonded to the face side 203 of the wafer 200 progressively from the central area to one end of the face side 203 of the wafer 200 in the Y-axis direction.

In the affixing step 1005, the control unit 100 controls the roller moving unit 50 to move the tape affixing roller 40 toward the opposite end of the wafer 200 in the other of the Y-axis directions, causing the tape affixing roller 40 to roll on the tape 210, and then bringing the tape 210 into intimate contact with the face side 203 of the wafer 200, until the tape affixing roller 40 moves to the opposite end of the wafer 200 in the other Y-axis direction, as illustrated in FIG. 6. According to the first embodiment, in the affixing step 1005, while the wafer 200 and the tape 210 are being heated, the tape 210 is then bonded to the face side 203 of the wafer 200 progressively from the central area to the opposite end of the face side 203 of the wafer 200 in the other Y-axis direction. According to the first embodiment, in the affixing step 1005, consequently, the tape 210 is bonded to the face side 203 of the wafer 200 progressively from the central area to one end of the face side 203 of the wafer 200 in one of the Y-axis directions, and thereafter the tape 210 is bonded to the face side 203 of the wafer 200 progressively from the central area to the opposite end of the face side 203 of the wafer 200 in the other Y-axis direction.

In the affixing step 1005, then, in the affixing apparatus 1, the control unit 100 stops operating the vacuum pump 64, closes the on-off valve 63, and controls the lifting and lowering unit 70 to lift the upper casing 61, thereby venting the vacuum chamber 60 to the atmosphere, as illustrated in FIG. 7, whereupon the tape affixing process, i.e., the affixing method, is ended. Under the atmospheric pressure, the tape 210 is pressed against the face side 203 of the wafer 200 and held in intimate contact therewith by being deformed complementarily to minute surface irregularities of the face side 203 of the wafer 200.

In this manner, the control unit 100 of the affixing apparatus 1 controls the tape affixing roller 40 to press the tape 210 against the face side 203 of the wafer 200, evacuates the vacuum chamber 60 while the tape affixing roller 40 is pressing the wafer 200 against the suction table 10, and controls the tape affixing roller 40 to roll on the tape 210 while the tape affixing roller 40 is pressing the wafer 200, thereby affixing the tape 210 to the wafer 200.

The affixing method and the affixing apparatus 1 according to the first embodiment described above are summarized as follows. While the vacuum chamber 60 is being vented to the atmosphere, the wafer 200 is held under suction on the suction table 10 in the holding step 1002, and the tape affixing roller 40 presses the wafer 200 against the suction table 10 with the tape 210 interposed therebetween in the pressing step 1003. Then, while the tape affixing roller 40 is pressing the wafer 200 against the suction table 10, the vacuum chamber 60 is evacuated to create a vacuum therein. Then, while the vacuum is being maintained in the vacuum chamber 60, the tape affixing roller 40 as it is pressing the wafer 200 rolls on the tape 210 to affix the tape 210 to the wafer 200.

Consequently, in the affixing method and the affixing apparatus 1 according to the first embodiment, since the tape affixing roller 40 presses the wafer 200, even if the vacuum chamber 60 is evacuated to create a vacuum therein and the suction force applied to hold the wafer 200 on the suction table 10 by a negative pressure produced by the suction source 14 is eliminated, the wafer 200 is prevented from moving on the suction table 10 while the tape 210 is being affixed to the wafer 200. Therefore, in the affixing method and the affixing apparatus 1 according to the first embodiment, the tape 210 can properly be affixed to the wafer 200 without using an electrostatic chuck because air bubbles are not trapped between the wafer 200 and the tape 210 and wrinkles are not formed in the tape 210. As a result, the affixing method and the affixing apparatus 1 according to the first embodiment are advantageous in that they can affix the tape 210 properly to the wafer 200 without using an electrostatic chuck.

Second Embodiment

Figure 8:
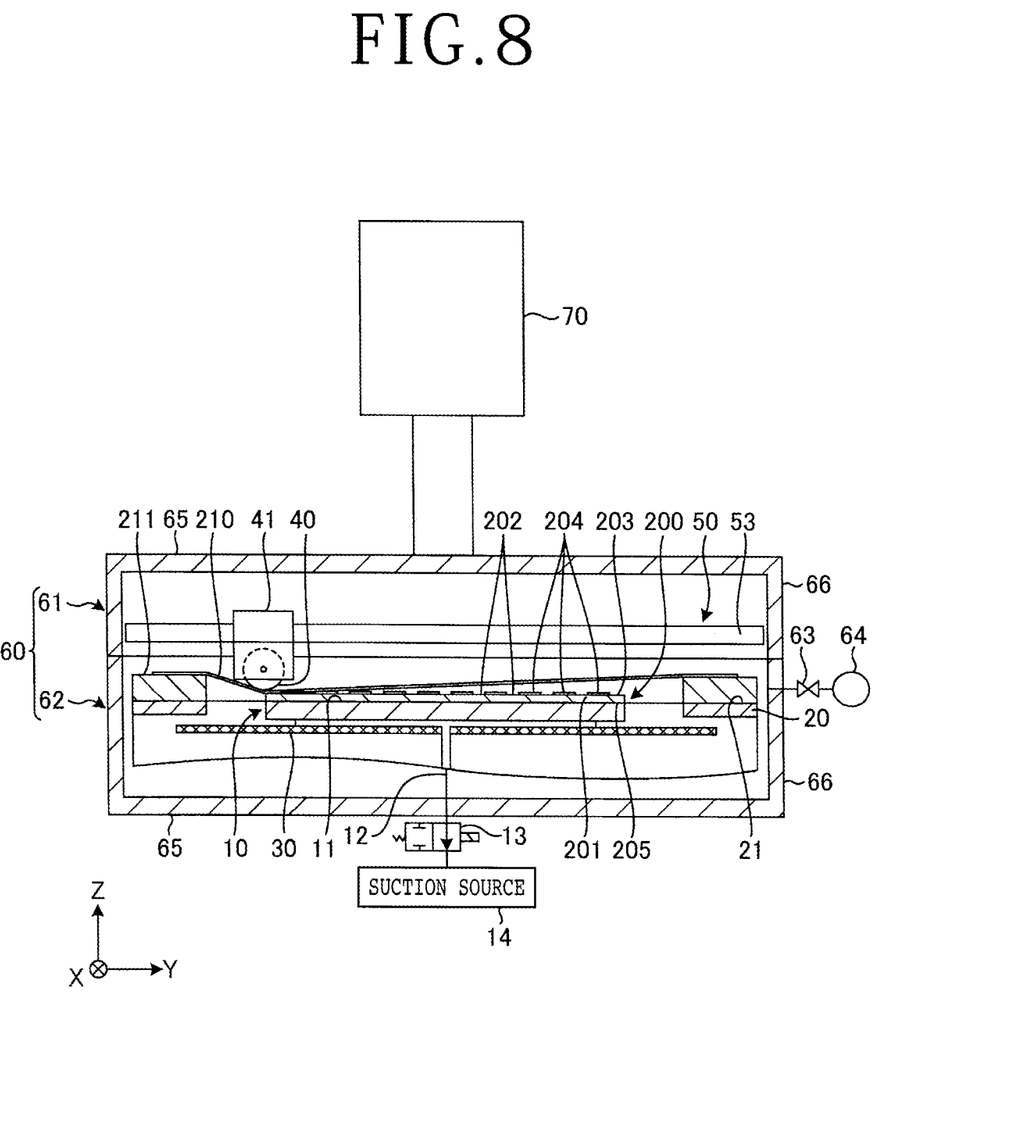
FIG. 8 is an enlarged cross-sectional view schematically illustrating a pressing step of an affixing method according to a second embodiment of the present invention.
Figure 9:
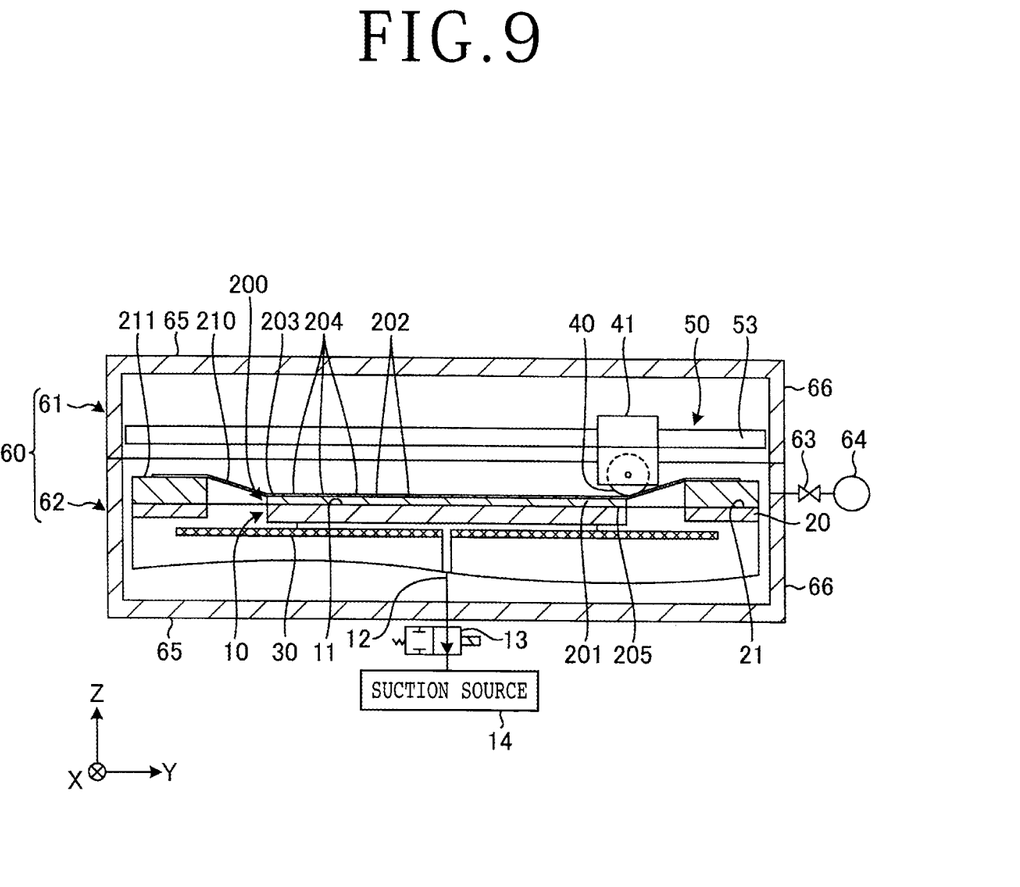
FIG. 9 is an enlarged cross-sectional view schematically illustrating a manner in which a tape affixing roller has been moved to a position above an end of a wafer in a Y-axis direction in an affixing step of the affixing method according to the second embodiment.

An affixing apparatus and an affixing method according to a second embodiment of the present invention will be described hereinbelow with reference to the drawings. FIG. 8 schematically illustrates in enlarged cross section a pressing step of the affixing method according to the second embodiment. FIG. 9 schematically illustrates in enlarged cross section the manner in which a tape affixing roller has been moved to a position above an end of a wafer in a Y-axis direction in an affixing step of the affixing method according to the second embodiment. Those parts illustrated in FIGS. 8 and 9 that are identical to those of the first embodiment are denoted by identical reference characters, and will be omitted from description. The second embodiment is identical with the first embodiment in that the affixing apparatus according to the second embodiment is identical to the affixing apparatus 1 according to the first embodiment, but is different from the first embodiment regarding the pressing step 1003 and the affixing step 1005 of the affixing method.

According to the second embodiment, in the pressing step 1003, the control unit 100 of the affixing apparatus 1 controls the roller moving unit 50 to position the tape affixing roller 40 above an opposite end of the holding surface 11 of the suction table 10 in one of the Y-axis directions and also controls the lifting and lowering unit 70 to lower the upper casing 61, causing the tape affixing roller 40 to press an opposite end of the tape 210 in the Y-axis direction against an opposite end of the wafer 200 and causing the tape affixing roller 40 to press the wafer 200 against the suction table 10, as illustrated in FIG. 8. According to the second embodiment, in the pressing step 1003, the tape affixing roller 40 thus presses the opposite end of the wafer 200 on its outer circumferential portion through the tape 210 interposed therebetween.

According to the second embodiment, in the evacuating step 1004, the control unit 100 of the affixing apparatus 1 controls the vacuum pump 64 to evacuate the vacuum chamber 60 to create a vacuum therein, as with the first embodiment.

According to the second embodiment, in the affixing step 1005, while the vacuum is being maintained in the vacuum chamber 60, the control unit 100 of the affixing apparatus 1 controls the roller moving unit 50 to move the tape affixing roller 40 toward one end of the wafer 200 in one of the Y-axis directions during which time the tape affixing roller 40 is pressing the wafer 200 held under suction on the suction table 10, against the suction table 10. According to the second embodiment, in the affixing step 1005, the control unit 100 of the affixing apparatus 1 controls the roller moving unit 50 to cause the tape affixing roller 40 to roll on the tape 210, causing the tape affixing roller 40 to bond and affix the tape 210 to the face side 203 of the wafer 200, until the tape affixing roller 40 moves to the one end of the wafer 200 in the Y-axis direction, as illustrated in FIG. 9.

According to the second embodiment, in the affixing step 1005, while the wafer 200 and the tape 210 are being heated, the tape 210 is bonded to the face side 203 of the wafer 200 progressively from the opposite end to the one end of the face side 203 of the wafer 200 in one of the Y-axis directions. According to the second embodiment, in the affixing step 1005, the vacuum chamber 60 is then vented to the atmosphere, as with the first embodiment.

With the affixing method and the affixing apparatus 1 according to the second embodiment, as is the case with the first embodiment, the tape 210 is affixed to the wafer 200 by causing the tape affixing roller 40 to press the wafer 200 and to roll on the tape 210 while the vacuum chamber 60 is being evacuated to create a vacuum therein. Therefore, even if the suction force applied to hold the wafer 200 on the suction table 10 by a negative pressure produced by the suction source 14 is eliminated, since the tape affixing roller 40 presses the wafer 200, the wafer 200 is prevented from moving on the suction table 10 while the tape 210 is being affixed to the wafer 200. As a result, the affixing method and the affixing apparatus 1 according to the second embodiment are advantageous in that they can affix the tape 210 properly to the wafer 200 without using an electrostatic chuck, as with the first embodiment.

Third Embodiment

Figure 10:
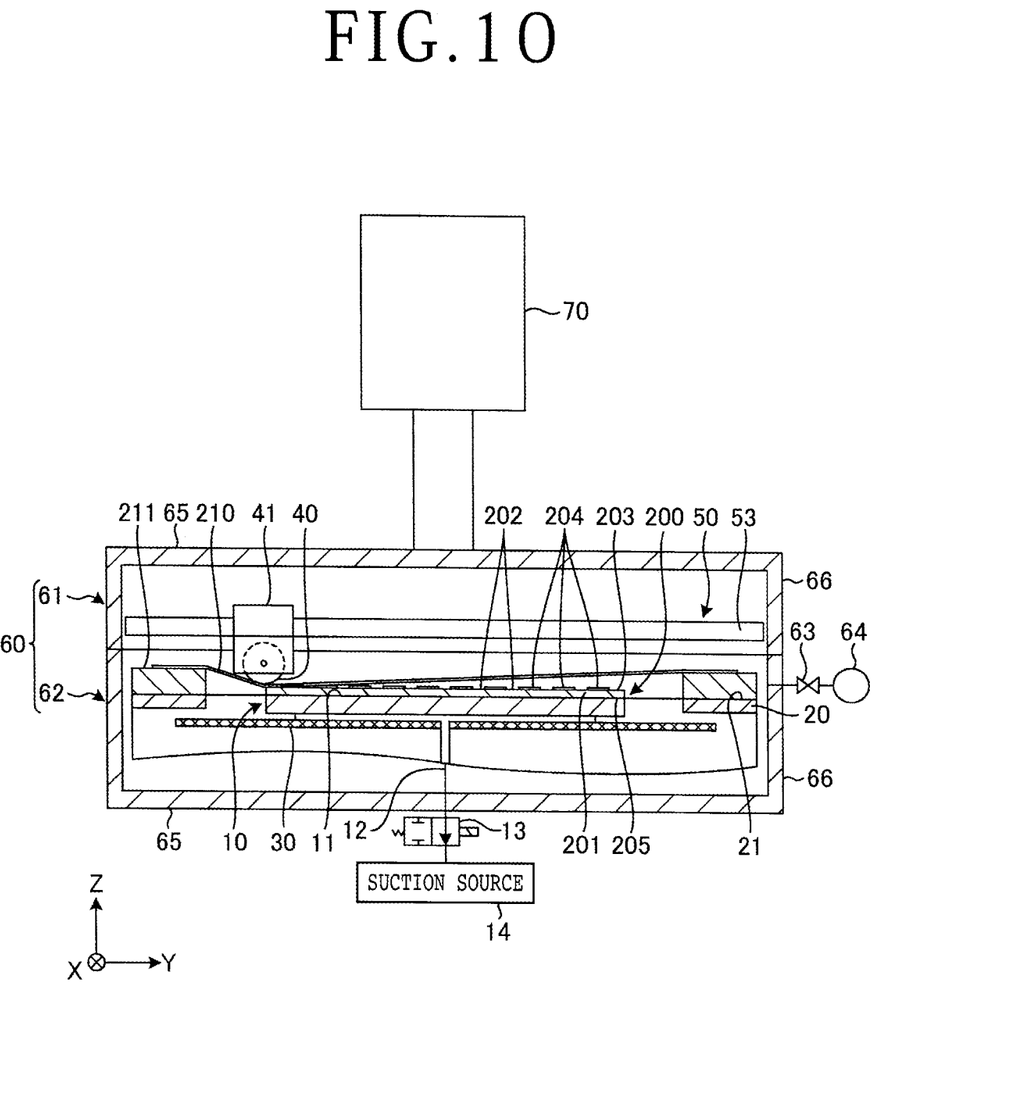
FIG. 10 is an enlarged cross-sectional view schematically illustrating a pressing step of an affixing method according to a third embodiment of the present invention.
Figure 11:
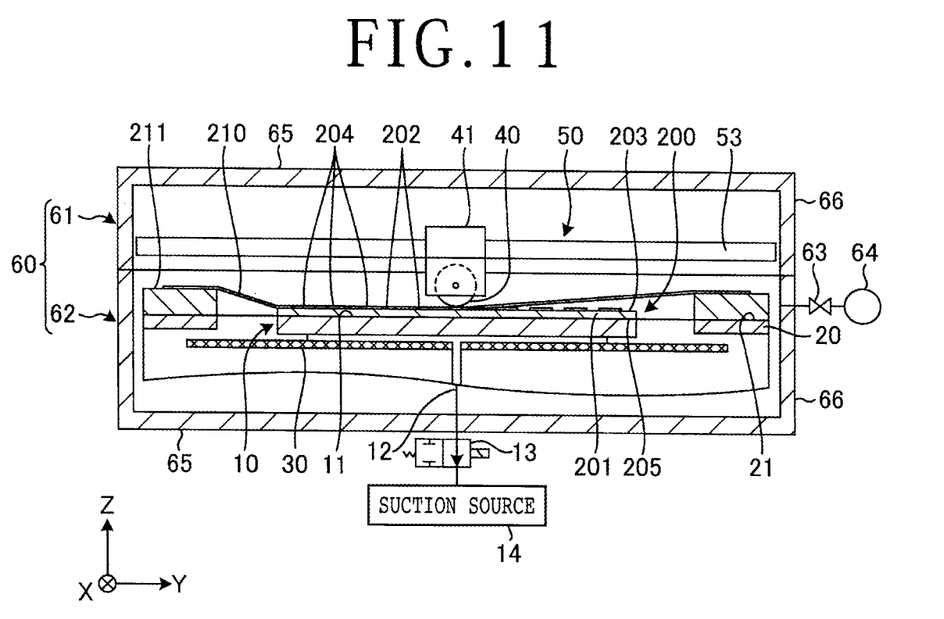
FIG. 11 is an enlarged cross-sectional view schematically illustrating a manner in which a tape affixing roller has been moved to a position above a central area of a wafer in a Y-axis direction in the pressing step of the affixing method according to the third embodiment.
Figure 12:
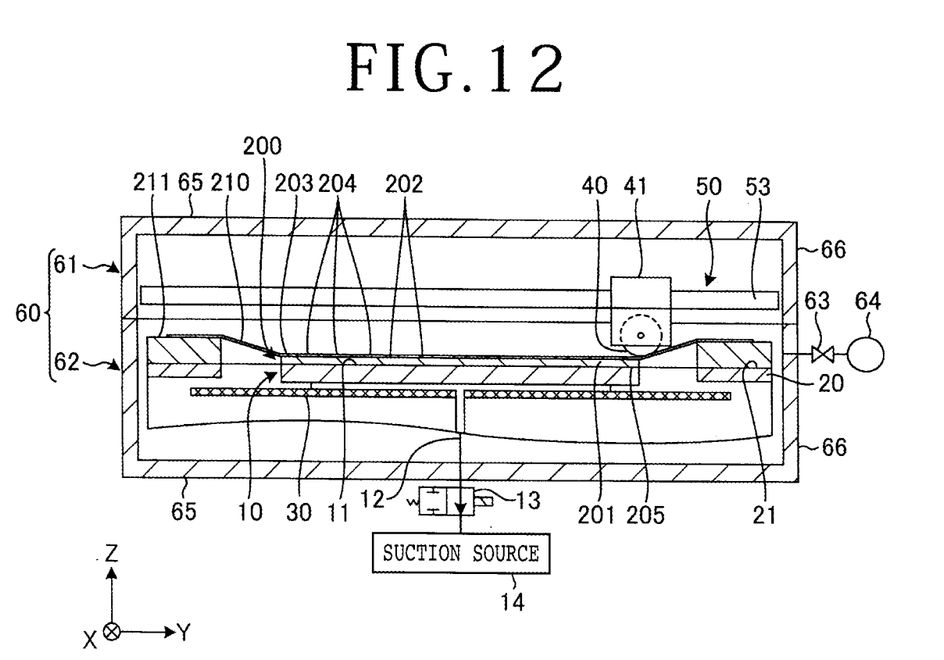
FIG. 12 is an enlarged cross-sectional view schematically illustrating a manner in which the tape affixing roller has been moved to a position above an end of the wafer in the Y-axis direction in the affixing step of the affixing method according to the third embodiment.

An affixing apparatus and an affixing method according to a third embodiment of the present invention will be described hereinbelow with reference to the drawings. FIG. 10 schematically illustrates in enlarged cross section a pressing step of the affixing method according to the third embodiment. FIG. 11 schematically illustrates in enlarged cross section the manner in which a tape affixing roller has been moved to a position above a central area of a wafer in a Y-axis direction in the pressing step of the affixing method according to the third embodiment. FIG. 12 schematically illustrates in enlarged cross section the manner in which the tape affixing roller has been moved to a position above an end of the wafer in the Y-axis direction in the affixing step of the affixing method according to the third embodiment. Those parts illustrated in FIGS. 10, 11, and 12 that are identical to those of the first embodiment are denoted by identical reference characters, and will be omitted from description. The third embodiment is identical with the first embodiment in that the affixing apparatus according to the third embodiment is identical to the affixing apparatus 1 according to the first embodiment, but is different from the first embodiment regarding the pressing step 1003 and the affixing step 1005 of the affixing method.

According to the third embodiment, in the pressing step 1003, the control unit 100 of the affixing apparatus 1 controls the roller moving unit 50 to position the tape affixing roller 40 above an opposite end of the holding surface 11 of the suction table 10 in one of the Y-axis directions and also controls the lifting and lowering unit 70 to lower the upper casing 61, causing the tape affixing roller 40 to press an opposite end of the tape 210 in the Y-axis direction against an opposite end of the wafer 200 and causing the tape affixing roller 40 to press the wafer 200 against the suction table 10, as illustrated in FIG. 10. According to the third embodiment, in the pressing step 1003, the tape affixing roller 40 thus presses the opposite end of the wafer 200 on its outer circumferential edge through the tape 210 interposed therebetween.

According to the third embodiment, in the pressing step 1003, while the control unit 100 of the affixing apparatus 1 is controlling the roller moving unit 50 to cause the tape affixing roller 40 to press the wafer 200 held under suction on the suction table 10 against the suction table 10, the control unit 100 moves the tape affixing roller 40 toward a central area of the wafer 200 in the Y-axis direction. According to the third embodiment, in the pressing step 1003, the control unit 100 of the affixing apparatus 1 controls the roller moving unit 50 to cause the tape affixing roller 40 to roll on the tape 210 to bond the tape 210 to the face side 203 of the wafer 200, until the tape affixing roller 40 moves to a position above the central area of the wafer 200 in the Y-axis direction, as illustrated in FIG. 11. According to the third embodiment, in the pressing step 1003, while the wafer 200 and the tape 210 are being heated, the tape 210 is bonded to the face side 203 of the wafer 200 progressively from the opposite end to the central area of the face side 203 of the wafer 200 in the Y-axis direction. According to the third embodiment, in the pressing step 1003, the tape affixing roller 40 presses the central area of the wafer 200 through the tape 210 interposed therebetween.

According to the third embodiment, in the evacuating step 1004, the control unit 100 of the affixing apparatus 1 controls the vacuum pump 64 to evacuate the vacuum chamber 60 to create a vacuum therein, as with the first embodiment.

According to the third embodiment, in the affixing step 1005, while the vacuum is being maintained in the vacuum chamber 60, the control unit 100 of the affixing apparatus 1 controls the roller moving unit 50 to move the tape affixing roller 40 from the central area to one end of the wafer 200 in the Y-axis direction during which time the tape affixing roller 40 is pressing the wafer 200 held under suction on the suction table 10, against the suction table 10. According to the third embodiment, in the affixing step 1005, the control unit 100 of the affixing apparatus 1 controls the roller moving unit 50 to cause the tape affixing roller 40 to roll on the tape 210, causing the tape affixing roller 40 to bond the tape 210 to the face side 203 of the wafer 200, until the tape affixing roller 40 moves to the one end of the wafer 200 in the Y-axis direction, as illustrated in FIG. 12.

According to the third embodiment, in the affixing step 1005, while the wafer 200 and the tape 210 are being heated, the tape 210 is bonded to the face side 203 of the wafer 200 progressively from the central area to one end of the face side 203 of the wafer 200 in the Y-axis direction. According to the third embodiment, in the affixing step 1005, in the affixing apparatus 1, the vacuum chamber 60 is then vented to the atmosphere, as with the first embodiment.

With the affixing method and the affixing apparatus 1 according to the third embodiment, as is the case with the first embodiment, the tape 210 is affixed to the wafer 200 by causing the tape affixing roller 40 to press the wafer 200 and to roll on the tape 210 while the vacuum chamber 60 is being evacuated to create a vacuum therein. Therefore, even if the suction force applied to hold the wafer 200 on the suction table 10 by a negative pressure produced by the suction source 14 is eliminated, since the tape affixing roller 40 presses the wafer 200, the wafer 200 is prevented from moving on the suction table 10 while the tape 210 is being affixed to the wafer 200. As a result, the affixing method and the affixing apparatus 1 according to the third embodiment are advantageous in that they can affix the tape 210 properly to the wafer 200 without using an electrostatic chuck, as with the first embodiment.

The present invention is not limited to the above embodiments. Various many changes and modifications may be made in the embodiments without departing from the scope of the invention. For example, according to the present invention, in the holding step 1002, the reverse side 205 of the wafer 200 may be placed on the holding surface 11 of the suction table 10, and then, the on-off valve 13 may be opened to hold the wafer 200 under suction on the holding surface 11 of the suction table 10. In the positioning step 1001, after the holding step 1002, the annular frame 211 to which the outer edge portion of the tape 210 has been affixed may be placed on the tape holding table 20, positioning the tape 210 in facing relation to the wafer 200 on the suction table 10, and the tape affixing roller 40 may be positioned in facing relation to the wafer 200 with the tape 210 interposed therebetween.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An affixing method of affixing a tape to a wafer, comprising:
   a holding step of holding the wafer under suction on a suction table by channeling air through a first suction channel;
   a positioning step of, before or after the holding step, positioning the tape in facing relation to the wafer on the suction table and positioning a tape affixing roller in facing relation to the wafer with the tape interposed therebetween;
   a pressing step of, after the holding step and the positioning step, pressing a portion of the tape against the wafer with the tape affixing roller and pressing the wafer against the suction table with the tape affixing roller;
   an evacuating step of, after the pressing step, evacuating a vacuum chamber that houses therein the suction table holding the wafer under suction thereon and the tape affixing roller through a second suction channel, while the tape affixing roller is pressing the portion of the tape against the wafer; and
   an affixing step of, after the evacuating step and when the suction table and the tape affixing roller are under vacuum in the vacuum chamber, causing the tape affixing roller to roll on the tape to affix the tape to the wafer while the tape affixing roller is pressing the wafer.

2. The affixing method according to claim 1, wherein the portion of the tape is a central area of the tape.

3. The affixing method according to claim 1, wherein the pressing step includes a step of causing the tape affixing roller to press an outer circumferential portion of the wafer through the tape interposed therebetween.

4. The affixing method according to claim 1, wherein the tape is free of a glue layer, and the affixing step includes a step of affixing the tape to the wafer while heating the wafer and the tape.

5. The affixing method according to claim 1, wherein the affixing step includes the tape affixing roller directly contacting the tape.

6. The affixing method according to claim 1, wherein the wafer comprises a first surface and a second surface, the first surface and second surface arranged on opposite sides of the wafer; and wherein the positioning step results in the first surface of the wafer facing the suction table, and the second surface of the wafer facing the tape affixing roller.

7. The affixing method according to claim 1, wherein the affixing step includes a first surface of the wafer directly contacting the suction table, and a second surface of the wafer directly contacting the tape.

* * * * *